(12) United States Patent
Shin

(10) Patent No.: US 7,343,530 B2
(45) Date of Patent: Mar. 11, 2008

(54) TURBO DECODER AND TURBO INTERLEAVER

(75) Inventor: Myeong-Cheol Shin, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 622 days.

(21) Appl. No.: 10/775,763

(22) Filed: Feb. 10, 2004

(65) Prior Publication Data

US 2005/0193308 A1 Sep. 1, 2005

(51) Int. Cl.
*H03M 13/27* (2006.01)
*H03M 13/45* (2006.01)

(52) U.S. Cl. ...................... 714/702; 714/780

(58) Field of Classification Search ............... 714/702, 714/780

See application file for complete search history.

(56) References Cited

U.S. PATENT DOCUMENTS

| | | | | |
|---|---|---|---|---|
| 5,042,033 A * | 8/1991 | Costa | ............. | 714/701 |
| 5,063,533 A * | 11/1991 | Erhart et al. | ............. | 711/157 |
| 5,572,532 A * | 11/1996 | Fimoff et al. | ............. | 714/702 |
| 5,592,492 A * | 1/1997 | Ben-Efraim et al. | ........ | 714/702 |
| 5,737,252 A * | 4/1998 | Hollmann et al. | .......... | 708/254 |
| 5,912,898 A * | 6/1999 | Khoury | ............. | 714/701 |
| 5,928,371 A * | 7/1999 | Robinson et al. | ........... | 714/702 |
| 6,289,486 B1 * | 9/2001 | Lee et al. | ............. | 714/788 |
| 6,466,564 B1 * | 10/2002 | Rakib et al. | ............. | 370/342 |
| 6,549,998 B1 * | 4/2003 | Pekarich et al. | ............. | 711/220 |
| 6,625,234 B1 * | 9/2003 | Cui et al. | ............. | 375/341 |
| 6,721,908 B1 * | 4/2004 | Kim et al. | ............. | 714/702 |
| 6,789,218 B1 * | 9/2004 | Edmonston et al. | ........ | 714/701 |
| 6,845,482 B2 * | 1/2005 | Yao et al. | ............. | 714/755 |
| 6,865,710 B2 * | 3/2005 | Bickerstaff et al. | ........ | 714/796 |
| 6,961,921 B2 * | 11/2005 | Hepler et al. | ............. | 714/796 |
| 7,051,261 B1 * | 5/2006 | Dhamankar | ............. | 714/755 |
| 7,058,974 B1 * | 6/2006 | Maher et al. | ............. | 726/13 |
| 7,127,664 B2 * | 10/2006 | Nicol et al. | ............. | 714/792 |
| 7,137,044 B2 * | 11/2006 | Ha et al. | ............. | 714/701 |
| 2002/0035709 A1 * | 3/2002 | Chen et al. | ............. | 714/702 |
| 2002/0159423 A1 * | 10/2002 | Yao et al. | ............. | 370/342 |
| 2003/0021338 A1 * | 1/2003 | Mazzoni et al. | ............. | 375/219 |
| 2003/0123579 A1 * | 7/2003 | Safavi et al. | ............. | 375/341 |
| 2004/0114596 A1 * | 6/2004 | Ha et al. | ............. | 370/389 |
| 2004/0170232 A1 * | 9/2004 | Ha et al. | ............. | 375/295 |
| 2004/0220988 A1 * | 11/2004 | Barry et al. | ............. | 708/446 |
| 2004/0255217 A1 * | 12/2004 | Garrett et al. | ............. | 714/746 |
| 2005/0102579 A1 * | 5/2005 | Yang | ............. | 714/752 |
| 2005/0157685 A1 * | 7/2005 | Gu et al. | ............. | 370/335 |
| 2005/0248473 A1 * | 11/2005 | Kukla et al. | ............. | 341/50 |
| 2006/0109158 A1 * | 5/2006 | Ettorre | ............. | 341/159 |

FOREIGN PATENT DOCUMENTS

KR 1020020020545 A 3/2002
KR 1020020067769 A 8/2002

* cited by examiner

*Primary Examiner*—Stephen M. Baker
(74) *Attorney, Agent, or Firm*—F. Chau & Associates, LLC.

(57) ABSTRACT

A processor on which a software-based interleaver is run performs interleaver generation, which is split into two parts to reduce the overhead time of interleaver changing. First, preprocessing prepares seed variables, requiring a small memory. Second, on-the-fly address generation generates interleaved addresses through simple adding and subtracting operations using the seed variables.

15 Claims, 12 Drawing Sheets

Fig. 6A

| 0 | 1 | 2 | 3 | 4 |
|---|---|---|---|---|
| 5 | 6 | 7 | 8 | 9 |
| 10 | 11 | 12 | 13 | 14 |
| 15 | 16 | 17 | 18 | 19 |

Fig. 6B

| 1 | 2 | 3 | 4 | 0 |
|---|---|---|---|---|
| 7 | 9 | 6 | 8 | 5 |
| 13 | 11 | 14 | 12 | 10 |
| 17 | 19 | 16 | 18 | 15 |

Fig. 6C

| 17 | 19 | 16 | 18 | 15 |
|---|---|---|---|---|
| 1 | 2 | 3 | 4 | 0 |
| 13 | 11 | 14 | 12 | 10 |
| 7 | 9 | 6 | 8 | 5 |

…

TURBO DECODER AND TURBO INTERLEAVER

TECHNICAL FIELD

The present invention relates to a data processing system, and more particularly to a turbo decoder and a turbo interleaver.

BACKGROUND OF THE INVENTION

Data signals, in particular those transmitted over a typically hostile RF interface (communication channel), are susceptible to error (channel noise) caused by the interface. Various methods of error correction coding have been developed in order to minimize the adverse effects that a hostile interface has on the integrity of communicated data. This is also referred to as lowering the Bit Error Rate (BER), which is generally defined as the ratio of incorrectly received information bits to the total number of received information bits. Error correction coding generally involves representing digital data in ways designed to be robust with respect to bit errors. Error correction coding enables a communication system to recover original data from a signal that has been corrupted.

Two types of error correction code are convolutional code and parallel concatenated convolutional code (so called turbo code). A convolutional code transforms input sequence of bits into an output sequence of bits through the use of finite-state-machine, where additional bits are added to the data stream to provide error-correction capability. In order to increase error-correction capability, the amount of additional bits added and the amount of memory present in the finite-state-machine need to be increased, which increases decoding complexity.

In the turbo coding system, a block of data may be encoded with a particular coding method resulting in systematic bits and two sets of parity bits. For generating a second set of parity bits, the original block of input data is rearranged with an interleaver and then encoded with the same method as that applied to the original input data used to generate a first set of parity bits. Encoded data (systematic bits and parity bits) are combined in some manner to form a serial bit stream and transmitted through the communication channel to a turbo decoding system. Turbo decoding systems operate on noisy versions of the systematic bits and the two sets of parity bits in two decoding stages to produce an estimate of the original message bits. The turbo decoding system uses an iterative decoding algorithm and consists of interleaver and deinterleaver stages individually matched to constituent decoding stages. The decoding stages of the turbo decoding system may use the BCJR algorithm, which was originally invented by Bahl, Cocke, Jelinek, and Raviv to solve a maximum a posteriori probability (MAP) detection problem. The BCJR algorithm is a MAP decoding algorithm in that it minimizes the bit errors by estimating the a posteriori probabilities of the individual bits in a code word. To reconstruct the original data sequence, the soft outputs of the BCJR algorithm are hard-limited. The decoding stages exchange with each other the obtained soft output information and iteration of decoding is ceased when a satisfactory estimate of the transmitted information sequence has been achieved.

As the turbo code has impressive performance, which is very close to Shannon capacity limits, the 3G mobile radio systems such as W-CDMA and cdma2000 have adopted turbo codes for channel coding.

3G wireless systems support a variable bit rate, which may result in full reconstruction of the turbo interleaver at every 10 ms or 20 ms frame. Accordingly, generating the whole interleaved address pattern at once consumes much time and requires a large-sized RAM to store the pattern.

Accordingly, a high speed turbo interleaver which can support a variable bit rate and that does not affect the performance of the turbo coder is required.

As is well-known, W-CDMA and cdma2000 transmission schemes are different in coding rate and interleaving. For example, the coding rate of W-CDMA can be ½, ⅓, ¼ or ⅕ but the coding rate of cdma2000 is ⅓, and the frame size of the W-CDMA is one of twelve numbers 378, 370, 762, . . . , and 20730, but that of the cdma2000 is an arbitrary integer between 40 and 5114, and the row size of the block interleaver in W-CDMA is 32 (8-14 of them are unused) but that of the cdma2000 can be 5, 10, or 20.

Accordingly, flexible and programmable decoders are required for 3G communication because global roaming is recommended between different 3G standards and the frame size may change on a frame base.

SUMMARY OF THE INVENTION

Embodiments of the present invention provide an interleaver. The interleaver comprises a preprocessing means for preparing seed variables and an address generation means for generating interleaved addresses using the seed variables on the fly. The seed variables are in forms of column vectors whose number of elements is equal to a number of rows of the two dimensional block interleaver. Consequently the number of seed variables is less than the size of a data block. If a generated interleaved address is larger than the size of the data block, the generated interleaved address is discarded.

In some embodiments, the seed variables include a base column vector, an increment column vector and a cumulative column vector. The number of elements of all three column vectors is equal to the number of rows of the interleaver block. The cumulative column vector is updated by adding the increment vector to an old cumulative column vector after interleaved addresses for one column are generated by adding the base column vector and the cumulative column vector. When updating the cumulative column vector, elements of the updated cumulative column vector larger than the number of columns in the data block are reduced by the number of columns in the data block.

Elements of the base column vector and the increment column vector arranged by are inter-row permutation.

Embodiments of the present invention provide a turbo decoding system. The turbo decoding system comprises an interleaver comprising a preprocessing means for preparing seed variables and an address generation means for generating interleaved address using the seed variables, an address queue for storing a generated interleaved address equal to or smaller than the interleaver size, an SISO decoder performing recursive decoding and calculating log likelihood ratio, and an LLR memory connected to the SISO decoder and storing the log likelihood ratio, wherein the SISO decoder accesses the input data and the log likelihood ratio alternately in a sequential order and in an interleaved order using the generated interleaved address.

In some embodiments, the generated interleaved address is reused as a write address for writing the log likelihood ratio outputted from the SISO decoder into the LLR memory.

Embodiments of the present invention provide a turbo decoding system comprising a processor for generating interleaved addresses and controlling hardware blocks, an address queue for storing the generated interleaved addresses, a buffer memory block including an LLR memory for storing a log likelihood ratio and a plurality of memory blocks for storing soft inputs, an SISO decoder connected to the buffer memory block, the SISO decoder including an ACSA network for calculating the log likelihood ratio recursively from soft inputs and the log likelihood provided by the LLR memory and a plurality of memory blocks for storing intermediate results of the ACSA network.

In some embodiments, the processor prepares seed variables when the interleaver structure changes due to a change of the coding standard or bit rate, and generates the interleaved addresses column by column using the seed variables by simple add and subtract operations when the interleaved addresses are required.

In some embodiments, the SISO decoder supports a Viterbi decoding mode. In the Viterbi decoding mode, the ACSA network performs a Viterbi recursion, the LLR memory stores traceback information outputted by the ACSA network, the processor performs traceback from the traceback information read from the LLR memory, and one of the memories of the SISO decoder stores a path metric outputted by the ACSA network.

In some embodiments, the processor is a single-instruction and multiple-data (SIMD) processor. Preferably, the SIMD processor includes five processing elements, wherein one of five processing elements controls the other four processing elements, processes scalar operation, and fetches, decodes, and executes instructions including control and multi-cycle scalar instructions, and wherein the other four processing elements only execute SIMD instructions.

Embodiments of the present invention provide an interleaving method for rearranging a data block in a data communication system. The interleaving method comprises preparing seed variables and generating interleaved addresses on the fly using the seed variables.

BRIEF DESCRIPTION OF THE DRAWINGS

The present invention will be more readily understood from the following detailed description of the invention when read in conjunction with the accompanying drawings, in which:

FIGS. 6A to 6C illustrate a simple example of prunable block interleaver with interleaver size N=18 according to conventional interleaving technique.

DETAILED DESCRIPTION OF THE INVENTION

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Before proceeding to describe the embodiments of the present invention, typical turbo coding system will be described with reference to FIGS. 1 to 4 for better understanding of the present invention.

Figure 1:
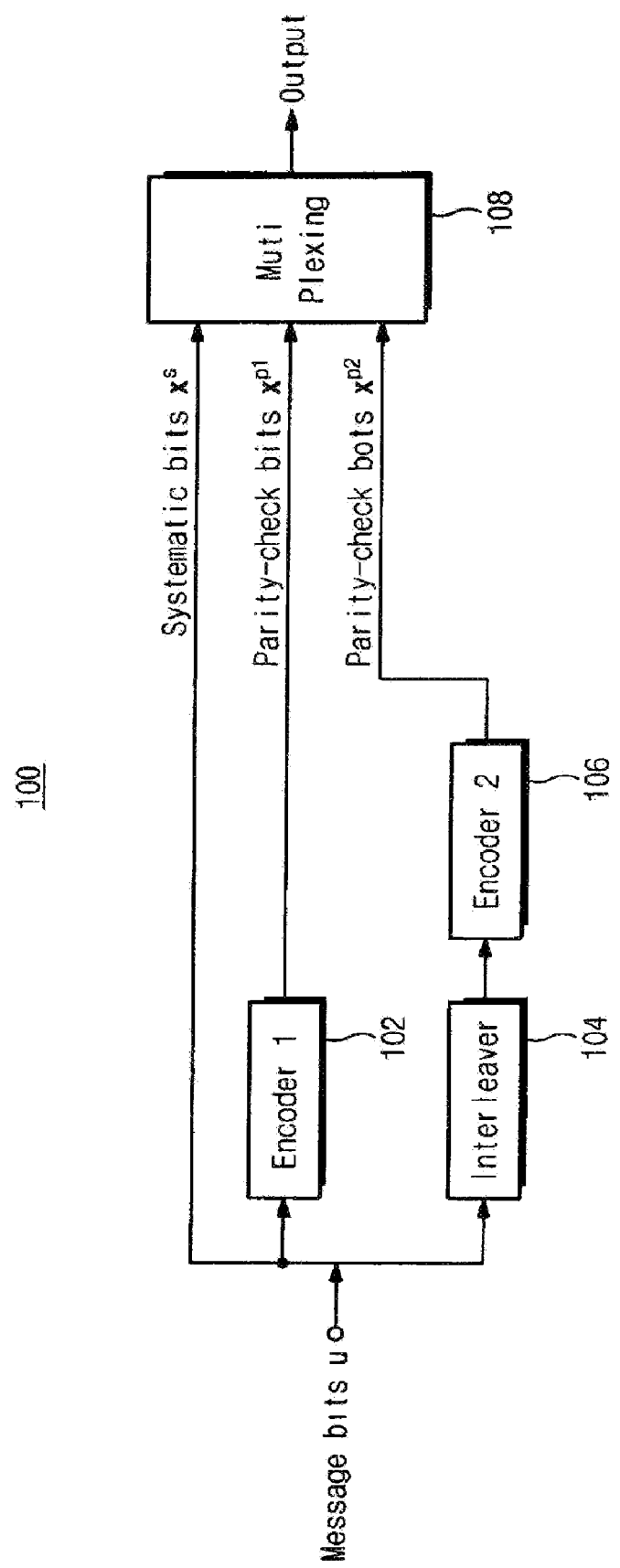
FIG. 1 illustrates a basic turbo-encoding system.
Figure 2:
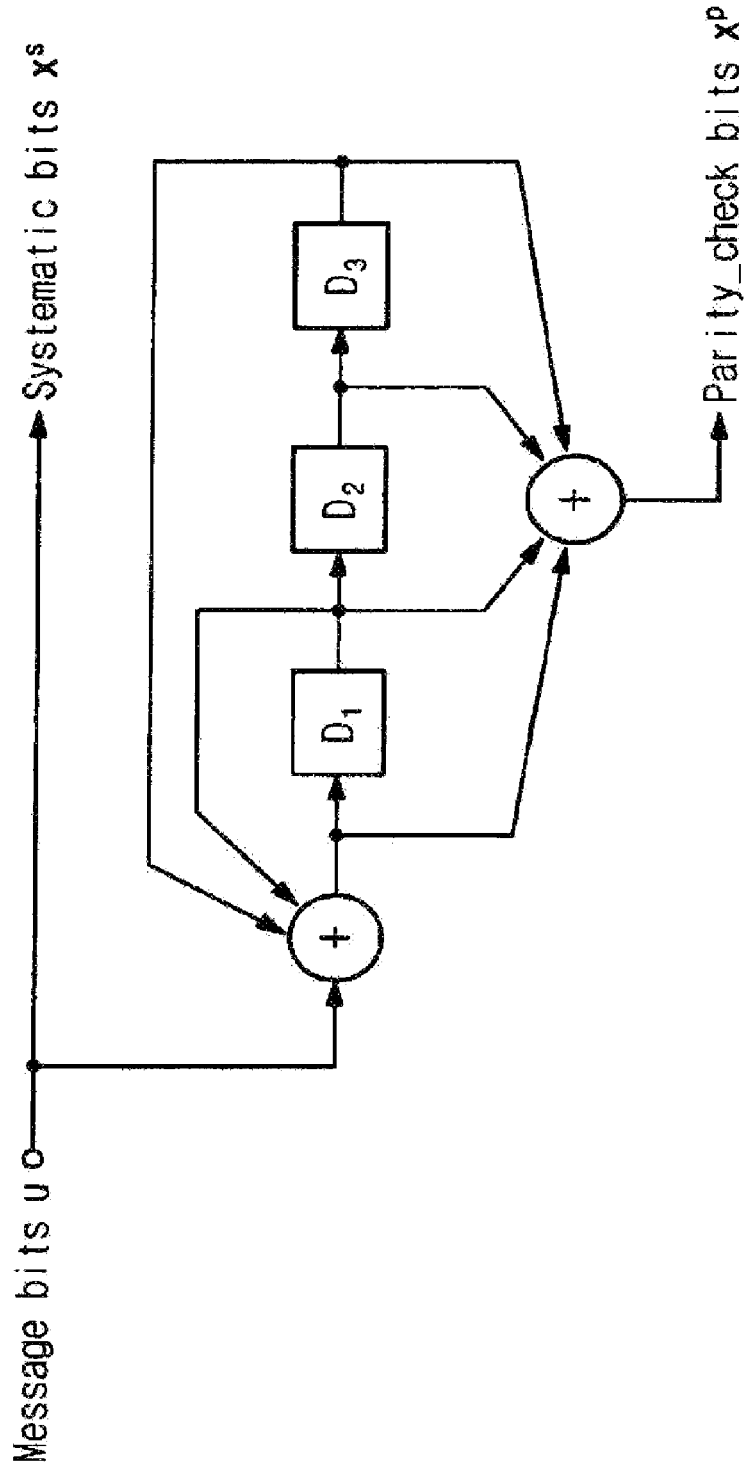
FIG. 2 illustrates a typical eight-state RSC encoder of FIG. 1.

FIG. 1 illustrates a basic turbo-encoding system 100 and FIG. 2 illustrates a typical eight-state RSC encoder 102, 106 of FIG. 1.

The encoder of the turbo coding system consists of two constituent systematic encoders 102, 106 joined together by means of an interleaver 104. Input data stream u is applied directly to first encoder 102, and the interleaved version of the input data stream u is applied to second encoder 106. The systematic bits (i.e., the original message bits) $x^s$ and the two sets of parity bits $x^{p1}$ and $x^{p2}$ generated by the two encoders 102, 106 constitute the output of the turbo encoding system 100 and are combined by a multiplexing means 108 to form a serial bit stream that is transmitted over the communication channel. Before transmission, puncturing may be performed if necessary.

The constituent encoder 102, 106 of the turbo encoding system is recursive systematic convolution (RSC) code encoder, where one or more of the tap outputs in the sift-register D1~D3 back to the input for obtaining better performance of the overall turbo coding strategy.

Figure 3:
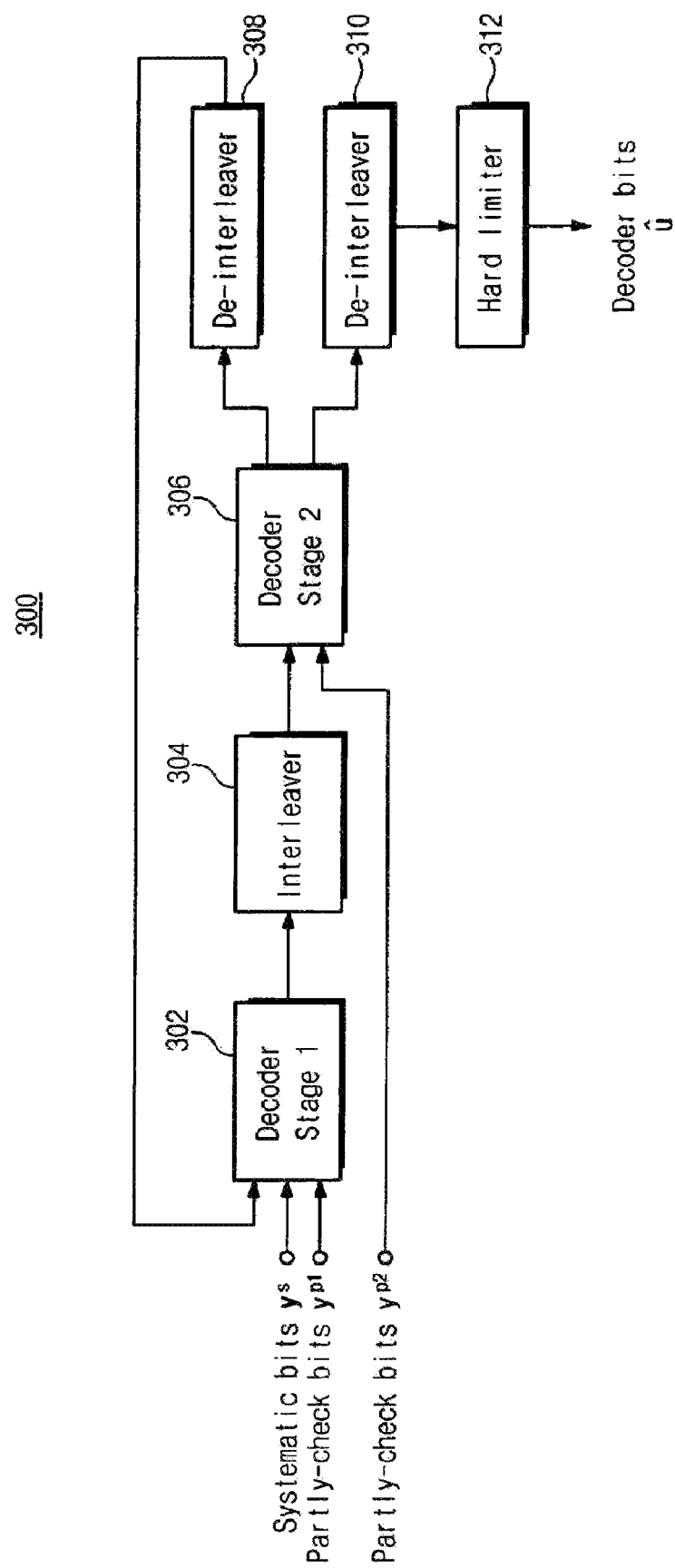
FIG. 3 shows a block diagram of the turbo decoding system.

FIG. 3 shows a block diagram of the turbo decoding system 300. The turbo decoder 300 operates on a noisy version of the systematic bits $y^s$ and the two set of parity bits $y^{p1}$ and $y^{p2}$. The turbo decoding system 300 uses an iterative decoding algorithm and consists of interleaver 304 and deinterleaver 308, 310 stages, individually matched to constituent decoding stages 302, 306. The systematic bits $y^s$ and first set of parity bits $y^{p1}$ of turbo encoded data are applied to the first SISO (Soft-Input-Soft-Output) decoder 302. Additionally, the deinterleaved version of the metrics output from the second SISO decoder 306 are fed back to the fist SISO decoder 302. The metrics output from the first SISO decoder 302 are applied to the second SISO decoder 306 via interleaver 304. The second set of parity bits $y^{p2}$ is applied to the second SISO decoder 306. The output of the deinterleaver 310 is applied to hard limiter 312 which outputs a bit stream of decoded data û corresponding to the original raw data u.

As stated earlier, the metrics output from the deinterleaver 308 are fed back to the input of the first SISO decoder 302.

Thus, the turbo decoding system 300 performs the nth decoding iteration with input metrics resulting from (n−1)th decoding iteration. The total number of iterations is either predetermined, or the iterations stop if a certain stopping criterion is met.

Figure 4:
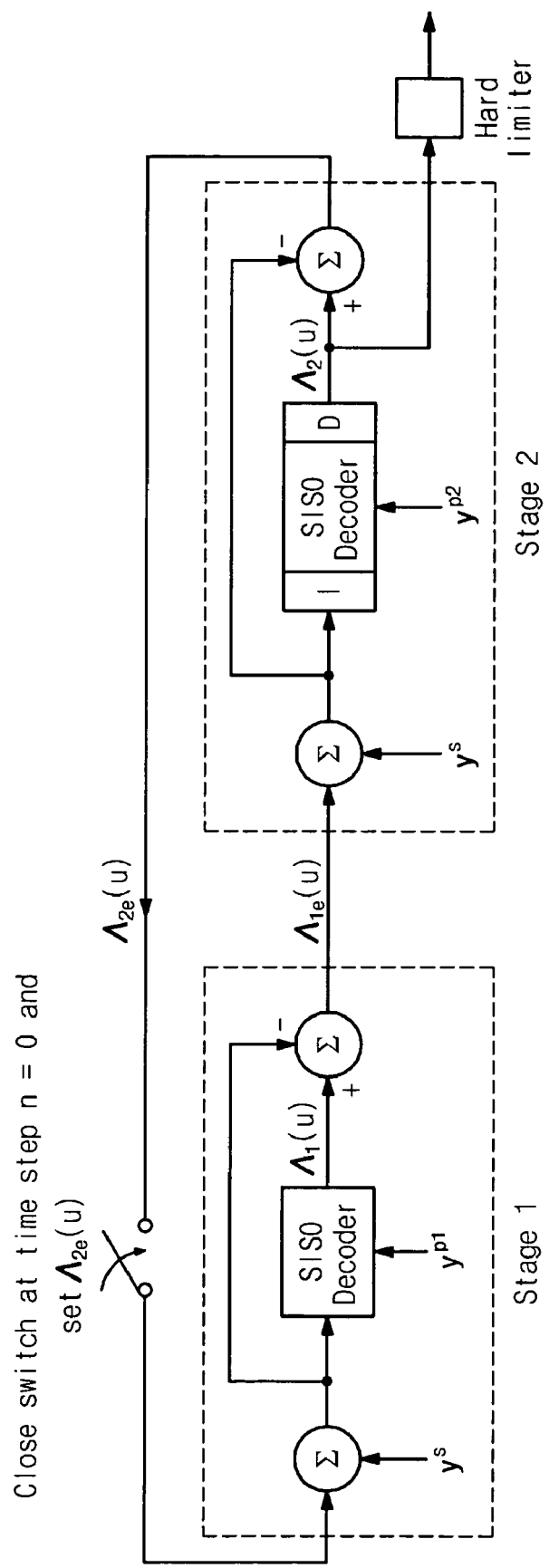
FIG. 4 shows an extrinsic form of the turbo decoding system of FIG. 3.

FIG. 4 shows an extrinsic form of the turbo decoding system of FIG. 3, where I stands for interleaver, D for deinterleaver, and SISO for soft-input soft-output decoder, which may use a Log-MAP decoding algorithm, a Max-Log-MAP, etc.

The first decoding stage produces a soft estimate $\Lambda_1(u_k)$ of a systematic bit $u_k$ expressed as a log-likelihood ratio $$\Lambda_1(u_k) = \log\{P(u_k=1|y^s, y^{p1}, \Lambda_{2e}(u))/P(u_k=0|y^s, y^{p1}, \Lambda_{2e}(u))\}, k=1, 2, \ldots,$$

$$N \quad (1)$$

where $y^s$ is the set of noisy systematic bits, $y^{p1}$ is the set of noisy parity bits generated by the first encoder 302, and $\Lambda_{2e}(u)$ is the extrinsic information about the set of message bits u derived from the second decoding stage and fed back to the first stage.

Hence, the extrinsic information about the message bits derived from the first decoding stage is $$\Lambda_{1e}(u) = \Lambda_1(u) - \Lambda_{2e}(u) \quad (2)$$

where $\Lambda_{2e}(u)$ is to be defined.

Before application to the second decoding stage, the extrinsic information $\Lambda_{1e}(u)$ is reordered to compensate for the interleaving introduced in the turbo encoding system 100. In addition, the parity bits $y^{p2}$ generated by the second encoder 106 are used as another input. Then by using BCJR algorithm, the second decoding produces a more refined soft estimate of the message bits u.

This estimate is de-interleaved to produce the total log-likelihood ratio $\Lambda_2(u)$. The extrinsic information $\Lambda_{2e}(u)$ fed back to the first decoding stage is therefore $$\Lambda_{2e}(u) = \Lambda_2(u) - \Lambda_{1e}(u) \quad (3)$$

where $\Lambda_{1e}(u)$ is itself defined by equation (2), and $\Lambda_2(u)$ is the log-likelihood ratio computed by the second decoding stage. Specifically, for the kth element of the vector u, where we have $$\Lambda_2(u_k) = \log\{P(u_k=1|y^s, y^{p2}, \Lambda_{1e}(u))/P(u_k=0|y^s, y^{p2}, \Lambda_{1e}(u))\}, k=1, 2, \ldots,$$

$$N \quad (4)$$

Through the application of $\Lambda_{2e}(u)$ to the first decoding stage, the feedback loop around the pair of decoding stages is thereby closed. Note that although in actual fact the set of noisy systematic bits $y^s$ is only applied to the first decoder 302 in FIG. 3, by formulating the information flow in the symmetric extrinsic manner depicted in FIG. 4 we find that $y^s$ is, in fact, also applied to the second decoding stage.

An estimate of message bits u is computed by hard-limiting the log-likelihood ratio $\Lambda_2(u)$ at the output of the second decoding stage, as shown by $\hat{u}=\text{sgn}(\Lambda_2(u))$, where the signum function operates on each element of $\Lambda_2(u)$ individually. To initiate the turbo decoding algorithm, we simply set $\Lambda_{2e}(u)=0$ on the first iteration of the algorithm.

Now a turbo decoding system of the present invention will be described. Embodiments of the present invention provide a multi-standard turbo decoding system with a processor on which a software interleaver is run. Particularly, the present invention provides a turbo decoding system with a configurable hardware SISO decoder and a programmable single-instruction and multiple-data (SIMD) processor performing flexible tasks such as interleaving. The software turbo interleaver is run on the SIMD processor. The decoding system of the present invention can also support the Viterbi decoding algorithm as well as a turbo decoding algorithm such as the Log-MAP algorithm and the Max-Log-MAP algorithm.

The processor generates interleaved addresses for turbo decoder, supporting multiple 3G wireless standards at the speed of the hardware SISO decoder and changing the interleaver structure (i.e., frame size and bit rate) at a very short time with a small memory. To hide the timing overhead of interleaving changing, the interleaved addresses generation is split into two parts, pre-processing and incremental on-the-fly generation. The pre-processing part prepares a small number of seed variables and the incremental on-the-fly generation part generates interleaved addresses based on the seed variables on the fly. When bit rate changes, the processor carries out the pre-processing part to prepare a small number of seed variables hence requiring a short time and a small memory. Whenever the interleaved address sequence is required, the processor generates the interleaved addresses using the seed variables. This splitting method reduces the timing overhead of the interleaver and requires only a small memory to save the seed variables.

Figure 5:
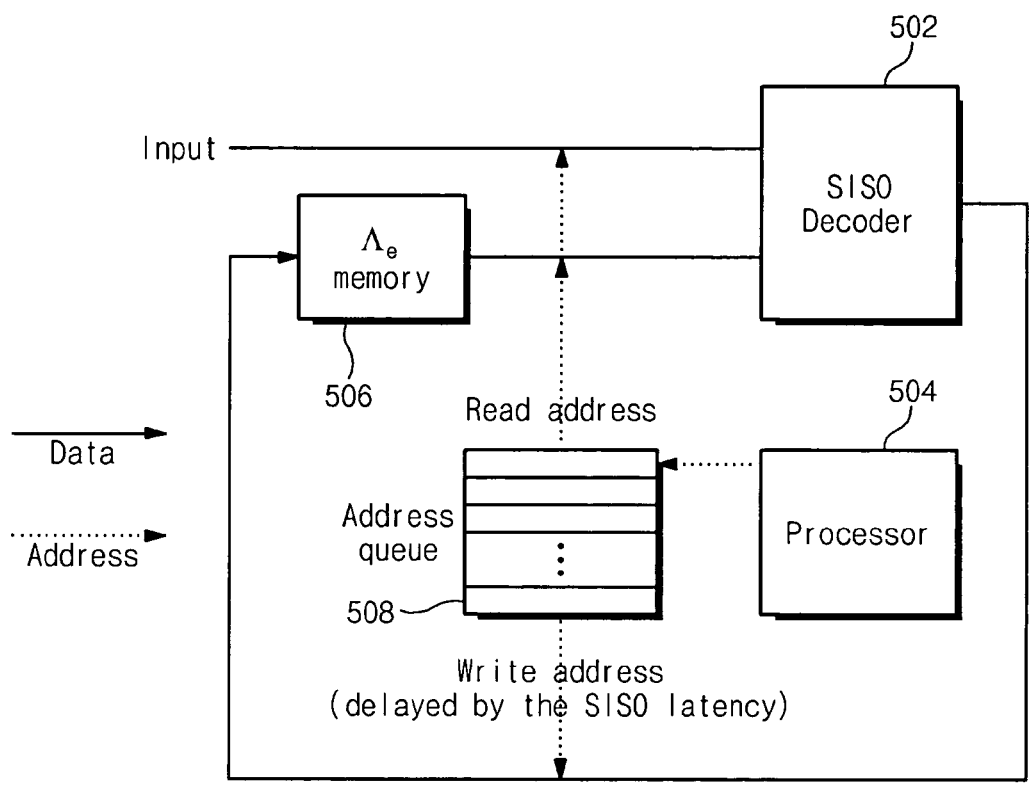
FIG. 5 schematically shows a block diagram of a time-multiplex turbo decoding system according to an embodiment of the present invention.

FIG. 5 schematically shows block a diagram of a time-multiplex turbo decoding system according to an embodiment of the present invention.

Turbo decoding system 500 of the present invention comprises an SISO decoder 502, processor 504 on which software interleaver is run and a $\Lambda_e$ memory 506 for storing an extrinsic log-likelihood ratio (LLR) as illustrated in FIG. 5. Data are sequentially stored in $\Lambda_e$ memory 506 as they are always read and written in-place. For each iteration, data are accessed in a sequential order for the oddth SISO decoding and in an interleaved order for the eventh SISO decoding. Namely, in the oddth (first) SISO decoding, SISO decoder 502 receives data in a sequential order from the $\Lambda_e$ memory 506 and calculates a log-likelihood ratio, and the log-likelihood ratio is written into the $\Lambda_e$ memory 506 in the sequential order. In the eventh (second) SISO decoding, SISO decoder 502 receives data in an interleaved order from the $\Lambda_e$ memory 506 and calculates a new log-likelihood ratio, and the new log-likelihood ratio is deinterleaved with the help of the address queue 508 and written into the $\Lambda_e$ memory 506 in the sequential order. As shown with the dotted lines, the processor 504 provides interleaved addresses to read data in an interleaved order. The address queue 508 saves the addresses in an interleaved order so that the addresses can be used as the write addresses for $\Lambda_e$ memory 506 when the SISO decoder 502 produces results after its latency. Accordingly, data in an interleaved order can be deinterleaved into the sequential order, and saved in the $\Lambda_e$ memory 506 in the sequential order.

In addition to interleaving, the processor 504 can control the hardware blocks or interface with an external host, and processes the trellis termination and a stopping criterion during the first SISO decoding that does not need interleaved addresses. In a Viterbi decoding mode, SISO decoder 502 is repeatedly used for the Viterbi recursion. The $\Lambda_e$ memory 506 plays the roles of the traceback memory. The processor 504 performs the traceback from the traceback information read from the $\Lambda_e$ memory 506.

Flexible software turbo interleaver run on the processor for turbo decoder will be described. To hide the timing overhead of interleaver change, the interleaved address generation is split into two parts, pre-processing and incremental on-the-fly generation. The pre-processing part prepares a small number of seed variables and the incremental on-the-fly generation part generates interleaved addresses based on the seed variables on the fly. When the interleaver size changes due to a change of bit rate or the communication standard itself, only the pre-processing part prepares a small number of seed variables, not all the interleaved address sequence. Through parallel processing using the seed variables, the processor generates interleaved addresses as fast as the hardware SISO decoding rate whenever the interleaved address sequence is required. The unit of on-the-fly address generation is a column of a block interleaver. Interleaved addresses are generated column by column, used for read addresses and stored in address queue, and then reused for write addresses for deinterleaving.

Before proceeding to describe interleaving techniques according to the embodiment of the present invention, conventional interleaving techniques will be described for better understanding of the present invention.

The turbo decoders for wireless system are based on block turbo interleavers. Although the operations and parameters vary depending on the standards, W-CDMA and cdma2000 share the prunable block interleaver structure where the interleaver is implemented by building a mother interleaver of a predefined size and then pruning unnecessary addresses. The mother interleavers can be viewed as two-dimensional matrices, where the entries are written in the matrix row by row and read out column by column. Before reading out the entries, intra- and inter-row permutations are performed.

FIGS. 6A to 6C illustrate a simple example of a typical prunable block interleaver with interleaver size N=18, where data indexes are written in a matrix form. Incoming data are written row by row in a two-dimensional matrix in memory as shown in FIG. 6A. FIG. 6B shows intra-row permutation data indexes from FIG. 6A. The intra-row permutation rule applied to this example is $$y_{ij} = b_i + [(j+1)*q_i] \bmod 5 \quad (5),$$

where $y_{ij}$ is the permuted index of the ith row and jth column, i and j are row and column indexes, respectively, $b=(b_0, b_1, b_2, b_3)=(0, 5, 10, 15)$, and $q=(q_0, q_1, q_2, q_3)=(1, 2, 3, 7)$. FIG. 6C shows inter-row permutation data result from FIG. 6B, which will be read out from the memory column by column as a sequence of 17, 1, 13, 7, 2, 11, 9, . . . , 0, 10, 5. The indexes 19, 18 exceeding the range of interest are pruned.

Now an interleaving technique according to an embodiment of the present invention will be described with the example of FIGS. 6A to 6C and with reference to FIGS. 7A and 7B.

The present embodiment uses an increment vector w of $w_j = q_i \bmod 5$ instead of q, and a cumulative vector $x_j$ of $$x_{ij} = [(j+1)*q_i] \bmod 5 \quad (6).$$

Equation (6) can be rewritten as $$y_{ij} = b_i + x_{ij} \quad (7)$$

and $x_j$ can be obtained recursively as $$x_{ij} = [(j+1)*(q_i \bmod 5)] \bmod 5 \quad (8)$$

$$= [(j+1)*w_i] \bmod 5$$

-continued $$= [(jw_i \bmod 5) + w_i] \bmod 5$$

$$= (x_{i,j-1} + w_i) \bmod 5,$$

where j=1, 2, 3, 4, 5 and $x_0$=w.

As $0 \leq x_{i,j-1} < 5$ and $0 \leq w_i < 5, 0 \leq x_{i,j-1} + w_i < 10$ and thus (9)

$$x_{i,j} = x_{i,j-1} + w_i - 5 \quad \text{if } x_{i,j-1} + w_i \geq 5,$$

$$= x_{i,j-1} + w_i \quad \text{otherwise}$$

According to the embodiments of the present invention, multiplication and modulo operations of equation (6) are replaced by cheaper operations; multiplication by an addition and the modulo by a comparison and subtract operation.

Figure 7A:
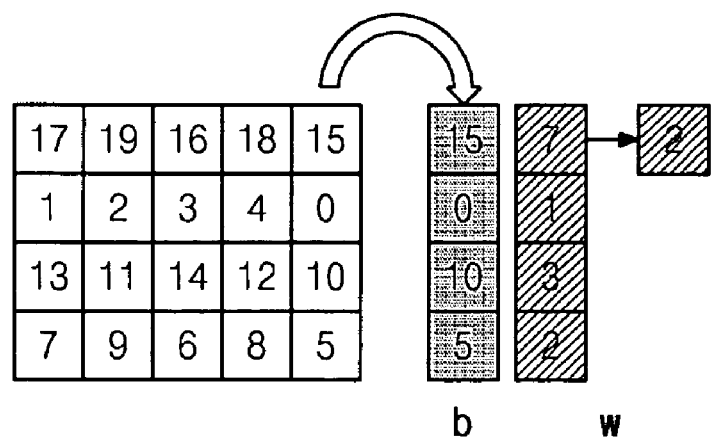
FIGS. 7A and 7B illustrate a simple example of prunable block interleaver with interleaver size N=18 according to the present invention.

As shown in FIG. 7A, b, w, and $x_0$ for the first column of the block interleaver are calculated and stored in vector register of the processor in the preprocessing stage. The number of elements of each vector b, w, and $x_0$ corresponds to the number of elements of a column. Right side of the FIG. 7A shows that b, w, and $x_0$ are stored in the order of inter-row permutation such as $b_3, b_0, b_2, b_1$=(15, 0, 10, 5), and w=$(w_3, w_0, w_2, w_1)$=(2, 1, 3, 2)=$x_0$ in advance so as to free the on-the-fly generation from the inter-row permutation.

Figure 7B:
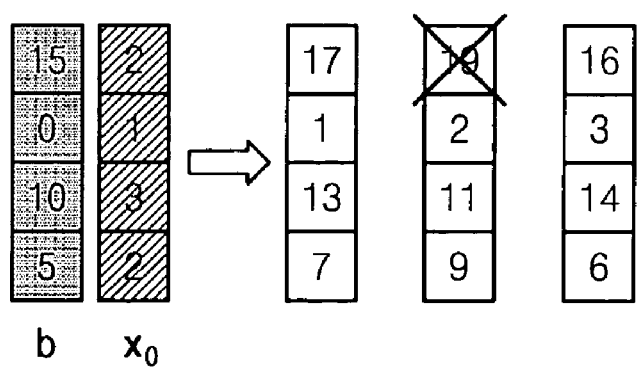

In the column by column on-the-fly address generation stage shown in FIG. 7B, the processor updates $x_j$ according to equation (9) and calculates the addresses based on equation (7). Calculated addresses are sent to the address queue, if they are smaller than interleaver size N.

Referring to FIG. 7B, interleaved addresses for first column ($y_{i,1}$) is calculated by adding $b_i + x_0$. Since $x_0$ is w, $y_{i,1}$ is calculated by adding $b_0$=(15, 0, 10, 5)+(2, 1, 3, 2)=(17, 1, 13, 7). After interleaved addresses for first column are calculated, $x_j$ is updated by adding $x_0$=(2, 1, 3, 2) and w=(2, 1, 3, 2). Thereby $x_1$ is set to (4, 2, 1, 4), where the third element of $x_1$ is 1 because (3+3) is larger than 5 and thus 5 is subtracted. Accordingly, interleaved addresses for the second column ($y_{i,2}$) are calculated by adding $b_i + x_1$=(15, 0, 10, 5)+(4, 2, 1, 4)=(19, 2, 13, 7), where first element 19 is discarded since it is larger than or equal to the size N (=18).

As described above, the present invention requires only small memory for storing the seed variables and performs add and subtract operations instead of modulo and multiplication operations.

The above example is a very simple one and the turbo interleavers in the real world such as W-CDMA and cdma2000 standard turbo interleavers are much more complex. However, the fundamental structure and the basic operations used in permutation rules are the same. The pseudocodes of the on-the-fly address generation for W-CDMA and cdma2000 are shown in Table 1 and Table 2, respectively.

In Table 1, C is the number of columns, R is the number of rows, p is a prime number, and s(x) is a permutation sequence, which are determined from the interleaver size N according to the specification of the W-CDMA standard. Likewise C, R, and the binary power $2^n$ in Table 2 are determined from N according to the cdma2000 specification.

The present invention handles those values also as seed variables and calculates them in advance at the preprocessing stage.

The on-the-fly generation flows of these real-world turbo interleavers are similar to the example. They also have base column vector b, increment column vector w, cumulative column vector x, and a certain modulo base, x is updated by adding w to the old x value. If elements of the updated x are larger than the modulo base, those elements of the updated cumulative column vector are reduced by the modulo base. This operation substitutes a computationally expensive modulo operation. Then the interleaved addresses for one column are generated by adding b and a vector that is calculated from x.

TABLE 1

0 column_counter = C−1
loop:
1 x=x + w
2 for each (i=0, 1, . . . , R−1) if($x_j \geq$ p −1) $x_i = x_i − (p-1)$
3 load s(x) from the data memory
4 y = b + s(x)
5 for each (i=0, 1, . . . , R−1) if ($y_i$ <N) send $y_i$ to the address queue
6 if((column_counter−−)≠ 0) goto loop

TABLE 2

0 column_counter = C−1
loop:
1 x=x + w
2 for each (i=0, 1, . . . , R−1) if($x_j \geq 2^n$) $x_i = x_i − 2^n$
3 y = b + x
4 for each (i=0, 1, . . . , R−1) if ($y_i$ <N) send $y_i$ to the address queue
5 if((column_counter−−)≠ 0) goto loop A SIMD (single-instruction and multiple-data) processor is suitable for this operation because the column is a vector and all the column entries go through exactly the same operations. However, in order to generate one address every one or two cycles, some special instructions may be used to make the long program short.

To speed up address generation, customized instructions can be used to reduce the length of the loop in the on-the-fly generation part. The present invention introduces three processor instructions: STOLT (store to output port if less than), SUBGE (subtract if greater or equal), and LOOP. Each of these instructions substitutes a sequence of three ordinary instructions but takes only one clock cycle to execute. For example, instruction STOLT corresponds to three RISC instructions, namely SUB x, y, z; BRANCH if z >=0; STO x. Likewise, SIMD instruction SUBGE corresponds to another group of three RISC instructions, namely SUB x, y, z; BRANCH is z <0; MOVE z, x.

Pruning can be mapped to STOLT. The function of STOLT is to send the calculated interleaved address to the address queue only if the calculated interleaved address is smaller than N, which is needed for the pruning as in line 5 of the pseudocode of Table 1 and line 4 of Table 2.

Another conditional instruction SUBGE, is useful for the block interleavers that frequently use modulo operations. Instruction SUBGE substitutes a modulo or remainder operation a mod b if the condition $0 \leq a < 2b$ is satisfied, which corresponds to (9) and line 2 of Table 1 and Table 2.

Adopted in several DSP processors to reduce the loop overhead of the address generation, LOOP instruction is also helpful in our application. The LOOP instruction conforms to a sequence of CMP, BNE (branch if not equal), and SUB instructions, which at once decrements the loop count and branches.

Using these special instructions, the present invention can reduce the lengths of the on-the-fly generation program loop of W-CDMA, cdma2000, and CCSDS to six, five, and four instructions, respectively. Using a loop-unrolling technique, the present invention can further shorten the loop length of the on-the-fly address generation parts by almost one instruction.

In the turbo interleaver pseudocodes of Table 1 and Table 2, each line corresponds to an instruction of the SIMD processor code. In Table 1, the line 2 corresponds to SUBGE, the line 5 to STOLT, and the line 6 to LOOP. The SUBGE safely substitutes $x_i = x_i$ mod (p−1) because the condition $0 \leq x_i < 2(p-1)$ is satisfied ($0 \leq x_i < p-1$ and $0 \leq w_i < p-1$ before they are added). If R=10 or 20 and the processor can process five data at once, lines 1-5 are repeated two or four times to produce an entire column of the interleaver matrix. Similarly, in Table 2 the line 2 corresponds to SUBGE, the line 4 to STOLT, and the line 5 to LOOP.

Figure 8:
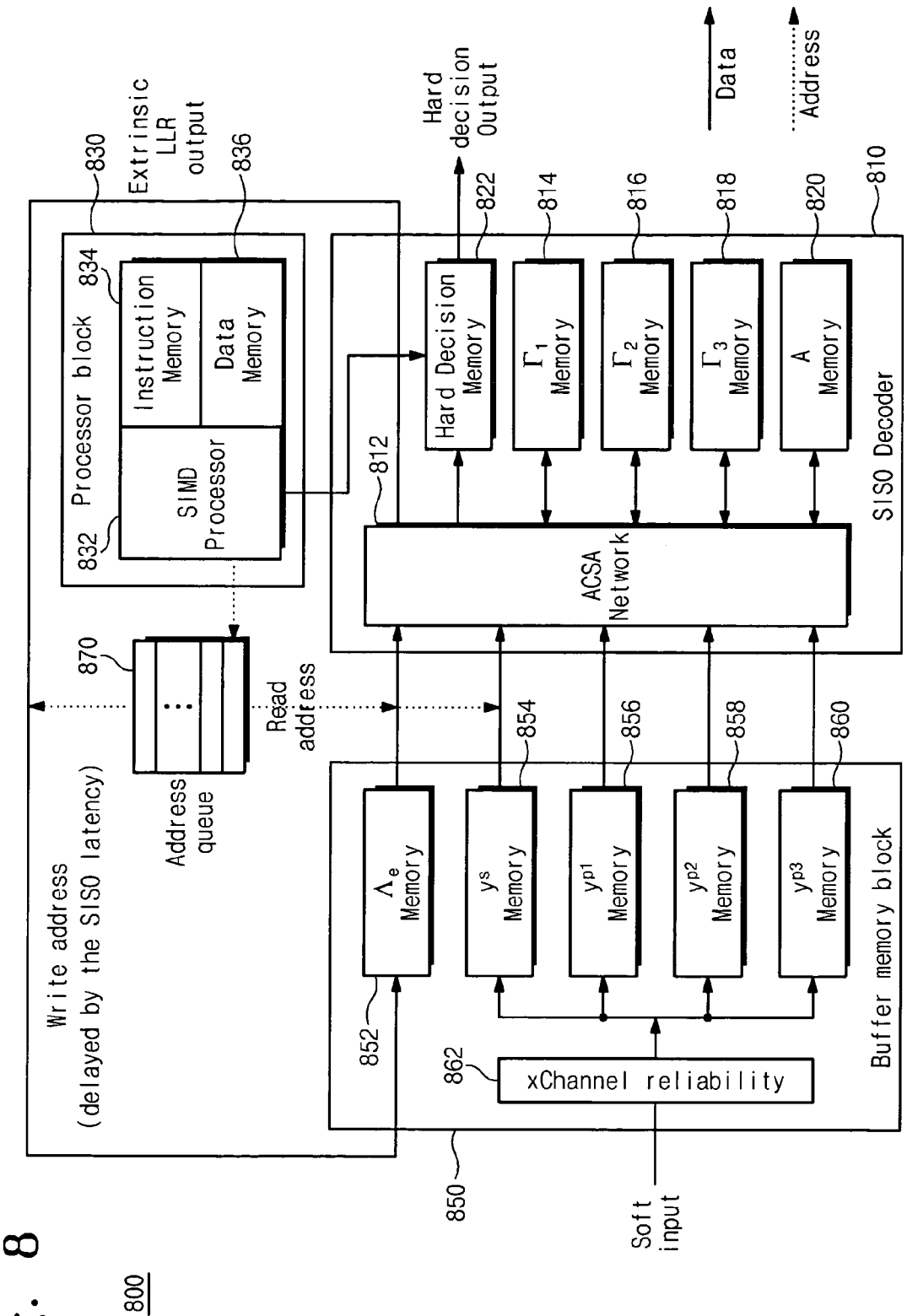
FIG. 8 illustrates a more specific block diagram of the turbo decoding system of FIG. 5 in turbo decoding mode.
Figure 9:
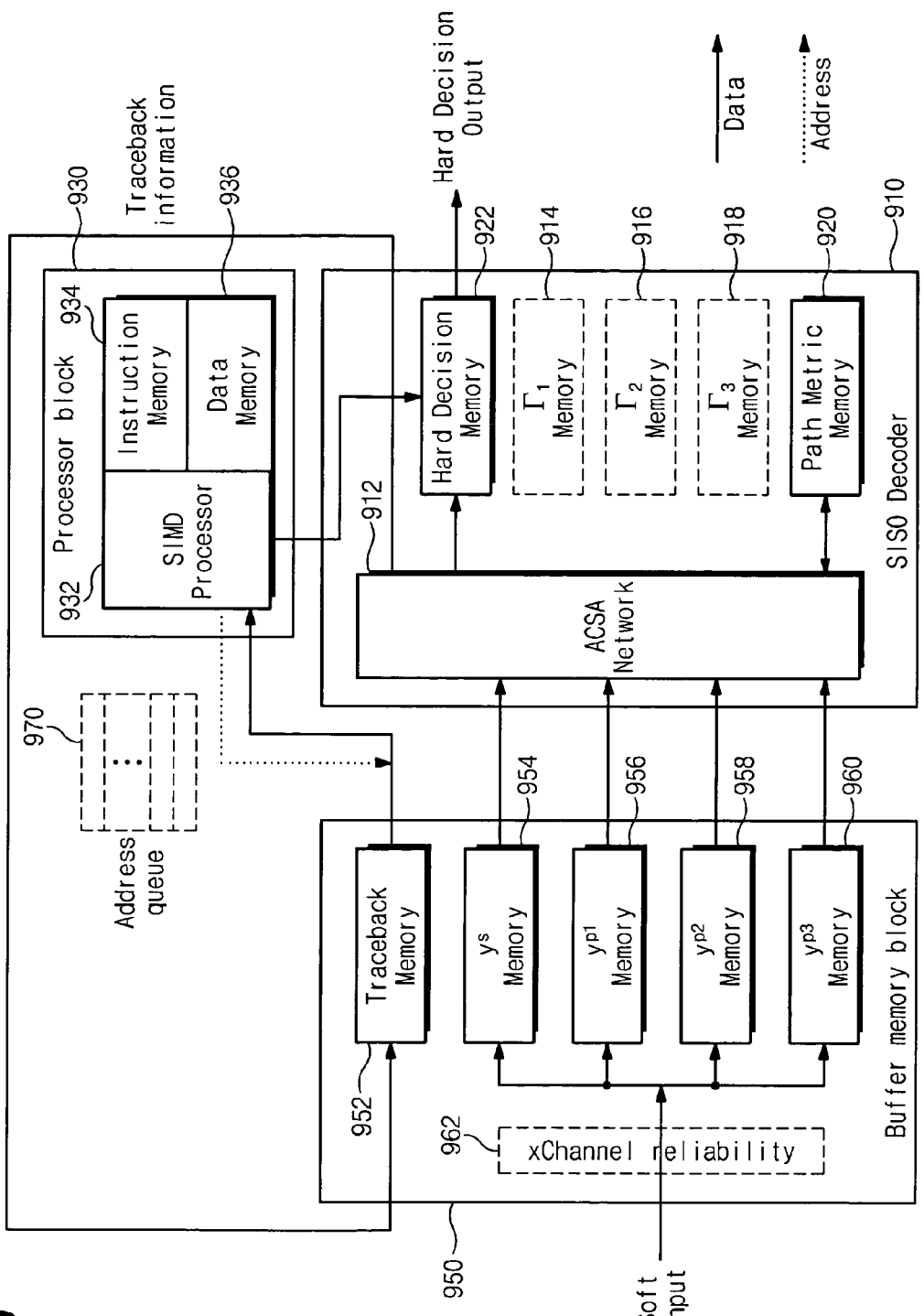
FIG. 9 illustrates a more specific block diagram of the turbo decoding system of FIG. 5 in Viterbi decoding mode.

FIG. 8 illustrates a block diagram of a decoding system, which can support turbo decoding and Viterbi decoding. FIG. 8 schematically shows data flow and address flow in a turbo decoding mode. In FIG. 8, a solid line indicates data flows and a dotted line indicates address flow. FIG. 9 schematically shows data flow and address flow in a Viterbi decoding mode.

Referring to FIG. 8, a turbo decoding system of the present invention comprises a SISO decoder 810, a processor block 830, a buffer memory block 850 and an address queue 870. The processor block 830 includes a SIMD (single-instruction and multiple-data) processor 832, an instruction memory 834, and a data memory 836. The SISO decoder 810 implements a typical sliding-window decoder. It includes an ACSA (add-compare-selector-add) network 812, and a plurality of memory blocks, $\Gamma_1$ memory 814, $\Gamma_2$ memory 816, $\Gamma_3$ memory 818, A memory 820 and a hard decision memory 822. The buffer memory block 850 includes a $\Lambda_e$ memory 852 for storing an extrinsic log-likelihood ratio (LLR), a plurality of memories for storing soft input data, $y^s$ memory 854 for storing a nosy systematic bits multiplied by the channel reliability 862, $y^{p1} \sim y^{p3}$ memories 856, 858, 860 for storing parity bits multiplied by the channel reliability 862.

The ACSA network 812 calculates forward metrics $A_k$ backward metrics $B_k$, and an extrinsic log-likelihood ratio (LLR). Memory blocks, $\Gamma_1$ memory 814, $\Gamma_2$ memory 816, and $\Gamma_3$ memory 818 store input data and the memory block A 820 temporarily stores the calculated forward metrics. A hard decision output from the ACSA network 812 is stored in the hard decision memory 822. The SIMD processor 832 also calculates a stopping criterion during SISO decoding from information stored in the hard decision memory 822. Input data are read into one of the memory blocks, $\Gamma_1$ memory 814, $\Gamma_2$ memory 816, and $\Gamma_3$ memory 818, and are used three times for calculating the forward metric $A_k$, the backward metric $B_k$, and the LLR $\Lambda(u_k)$.

The software interleaver is run on the SIMD processor 832. As described earlier, The SIMD processor 832 generates interleaved addresses column by column and the address queue 870 saves the interleaved addresses. When the SIMD processor 832 calculates interleaved read addresses, the address queue 870 whose length is the SISO latency saves the interleaved addresses in order to sue them again as the write addresses into the $\Lambda_e$ memory 852. Namely, when the ACSA network 812 produces results using the data read from the interleaved addresses, the results are stored into the corresponding place of the $\Lambda_e$ memory 852 with the write address stored in the address queue 870. In addition to the interleaving, the SIMD processor 832 controls the hardware blocks, interfaces with an external host, and processes the trellis termination and a stopping criterion during SISO decoding that does not need an interleaver.

Since the Viterbi algorithm does not calculate backward metrics in the Viterbi decoding mode, some components of FIG. 8 are unused as shown in FIG. 9. In FIG. 9, components illustrated by a dotted line such as a address queue 970, a channel reliability multiplication 962, and three Γ memories blocks 914, 916, 918 are not used in the Viterbi decoding mode. The $\Lambda_e$ memory 852 of FIG. 8 serves as a traceback memory 952 and the A memory 820 of FIG. 8 serves as a path metric memory. The SIMD processor 923 processes the traceback from the traceback information read from traceback memory 952. SISO network 912 is used for the Viterbi forward trellis recursion.

Figure 10:
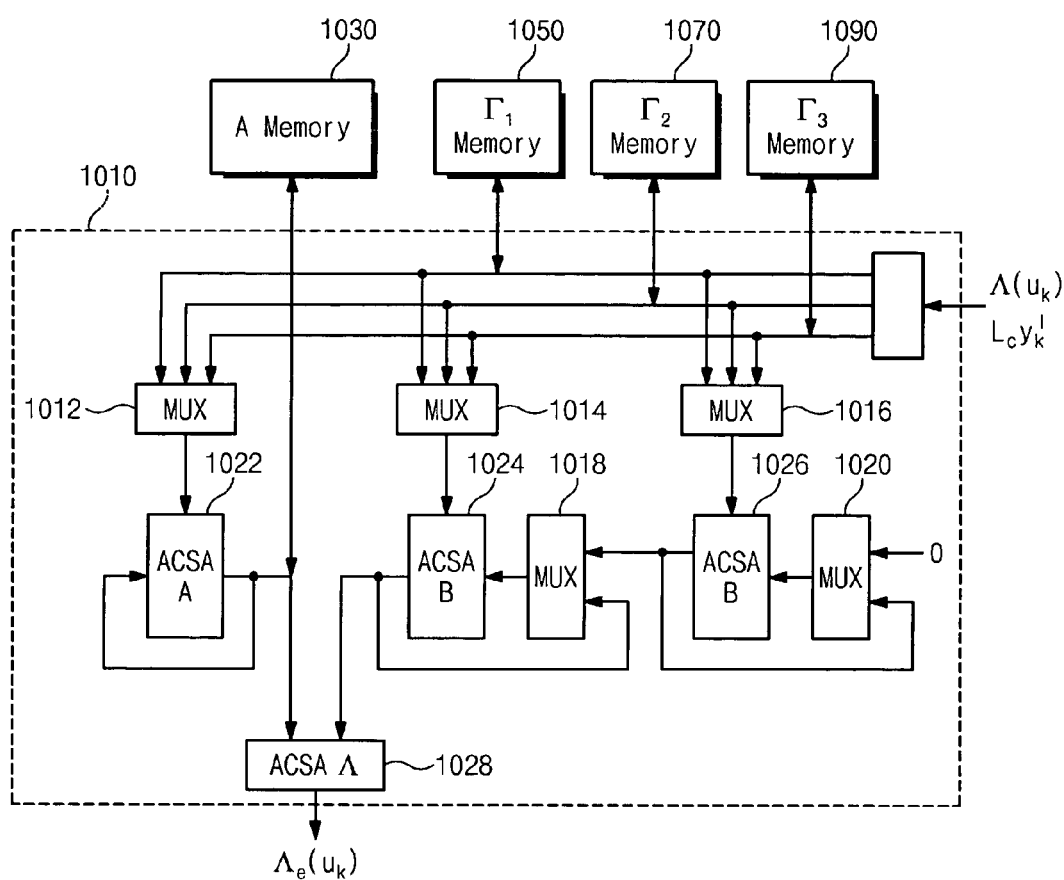
FIG. 10 schematically shows in further detail the ACSA network and related memory blocks of FIG. 8.
Figure 11:
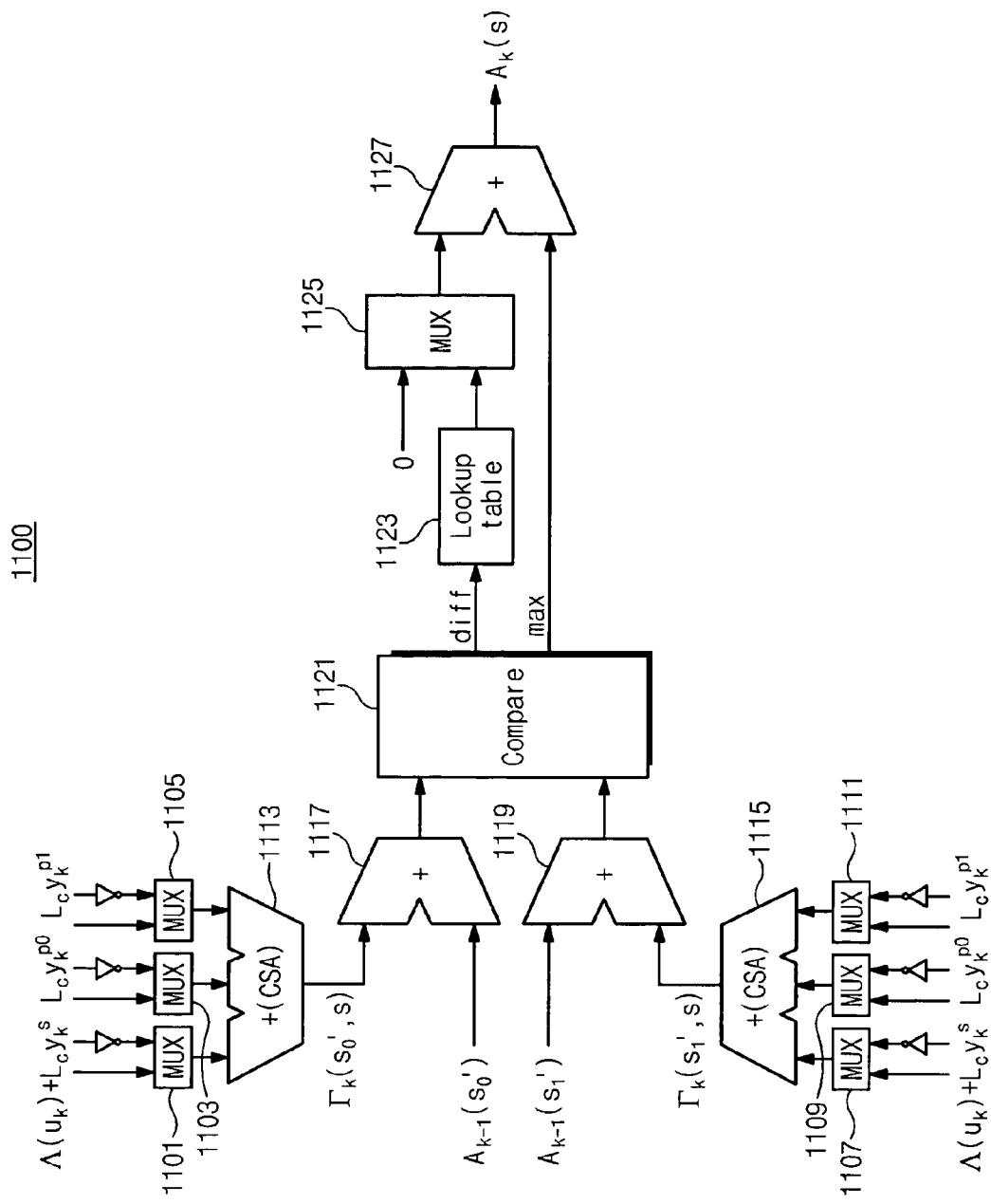
FIG. 11 shows an ACSA unit contained in the ACSA A section 1022 of FIG. 10 for calculating a forward metric $A_k(s)$.

FIG. 10 schematically shows a detailed view of an ACSA network and related memory blocks of FIG. 8. The SISO decoder 1000 in FIG. 10 implements a sliding window turbo decoding technique in hardware. The ACSA network 1010 includes multiplexers 1012, 1014, 1016, 1018, 1020 and ACSA A 1022, two ACSA B 1024, 1026, and ACSA A 1028. ACSA A 1022 and ACSA B 1024 comprise eight ACSA units and ACSA A 1028 comprises fourteen ACSA units. An exemplary ACSA unit of ACSA A 1002 is illustrated in FIG. 11.

After input data sequences are stored in the $\Gamma_1$ memory 1050 and $\Gamma_2$ memory 1070, SISO decoding starts while new interleaved data sequences are stored in the $\Gamma_3$ memory 1090.

To implement the sliding window, first window sizes of L input data are stored in Γ memories 1050, 1070, 1090. According to the MAP algorithm, this block of written values is read three times. These three operations are performed in parallel in each ACSA sections in FIG. 10. The ACSA B section 1026 implements a sliding window algorithm, which requires a dummy backward recursion of depth L. In order to avoid the use of a multiple-port memory, three separated Γ memories of depth L are used so that the defined operations operate on them in a cyclic way. A memory 1030 temporarily stores the calculated $A_k(s)$'s.

The SISO outputs are obtained in the reversed order, but the correct order can be restored by properly changing the interleaving rules of the decoder.

To support multiple standards, configurable ACSA units can be employed in the SISO decoder in FIG. 10. The ACSA unit shown in FIG. 11 can be adapted to various RSC codes of different constraint length K, different coding rates of ½ to ⅕, and/or an arbitrary generated polynomial.

The Log-MAP algorithm outperforms the Max-Log-MAP algorithm if the channel noise is properly estimated. However, it is reported that the Max-Log-MAP is more tolerant to the channel estimation error than the Log-MAP algorithm. Thus present invention provides the ACSA unit that can be selected to use the Log-MAP or the Max-Log-MAP algorithm.

FIG. 11 shows an ACSA unit contained in the ACSA A section 1022 for calculating forward metric $A_k(s)$ of FIG. 10. Forward metric $A_k(s)$ is calculated by equation (10)

$$A_k(s) = \ln\left(\sum_{s'} \exp[A_{k-1}(s') + \Gamma_k(s', s)]\right) \quad (10)$$
$$\approx \max_{s'}(A_{k-1}(s') + \Gamma_k(s', s))$$

where $A_k(s')$ is the forward metric of state s' at the previous time stamp k-1 and $\Gamma_k(s', s)$ is the logarithmic branch probability that the trellis state changes from s' to s at time stamp k. The ACSA unit 1100 includes input multiplexers 1101, 1103, 1105, 1107, 1109, 1111, two adder blocks (CSA) 1113, 1115, two input adders 1117, 1119, a comparator 112, a lookup table 1123, an output multiplexer 1127, and an output adder 1127.

Two adder blocks (CSA) 1113, 1115 calculate branch probabilities $\Gamma_k(s', s)$ given by equation (11)

$$\Gamma_k(s', s) = \frac{1}{2}\left(x_k^s[\Lambda_e(u_k) + L_c y_k^s] + L_c \sum_{l=1}^{n} y_k^l x_k^l\right) \quad (11)$$

where $\Lambda_e(u_k)$ is the extrinsic LLR information from the previous SISO decoding and $L_c$ is channel reliability. Input data $\Lambda(u_k)+L_c y_k^s$, $L_c y_k^{p0}$, and $L_c y_k^{p1}$ are selected by multiplexers 1101, 1103, 1105, 1107, 1109, 1111 which can change the coding rate and the transfer function. The input adder 1117 adds output branch probabilities $\Gamma_k(s_0', s)$ of the adder block 1113 and incoming data $A_{k-1}(s_0')$. The input adder 1119 adds output branch probabilities $\Gamma_k(s_1', s)$ of the adder block 1115 and incoming data $A_{k-1}(s_1')$. The comparator 1121 receives two inputs from the input adders 1117, 1119 and outputs a max value of the two inputs and a differential value between two inputs. The differential value is used to look up the table 1123 that stores approximation offsets of (10), and a max value is transferred in the output adder 1127. The output multiplexer 1125 selects decoding algorithm, Log-MAP or Max-Log MAP. If 0 is selected at the multiplexer 1125, output $A_k(s)$ of the adder 1127 is given as $A_k(s)=\max(A_{k-1}(s')+\Gamma_{k-1}(s', s)$, which corresponds to Max-Log MAP algorithm. Otherwise if the lookup table value is selected, output $A_k(s)$ of the adder 1127 is given as $A_k(s)=\ln(\exp[A_{k-1}(s')+\Gamma_{k-1}(s', s)])$, which is compensated by the offset read from the lookup table and corresponds to Log-MAP algorithm.

In conventional hardware SISO decoders, the calculation of $\Gamma_k(s', s)$ is fixed, as all the $x_k^1$'s are fixed for the target turbo code. However, the present invention can change the $x_k^1$ values by configuring the input multiplexers in FIG. 11. This allows the change in coding rate and the generation of polynomials from the RSC encoder. The ACSA unit in the figure can support rates between ½ and ⅕ turbo codes with arbitrarily generated polynomials. To support a lower coding rate, the input to $\Gamma_k(s', s)$ calculation logic should be increased. To support multiple constraint lengths K, the number of ACSA units and an interconnection between the units can be changed. As mentioned above, the multiplexer 1125 in the right determines the decoding algorithm: Log-MAP or Max-Log-MAP. If the reliable channel estimation from external host, which calculates the channel estimation, is obtained, for example, using a power control bit of the 3G communication systems, we can obtain better performance with the Log-MAP algorithm by setting the number of multiplexer passes to the look-up table value. On the other hand, if nothing is known about the channel, the Max-Log-MAP is used to avoid error due to channel misestimation error by passing 0 to the final adder of the ACSA unit.

Figure 12:
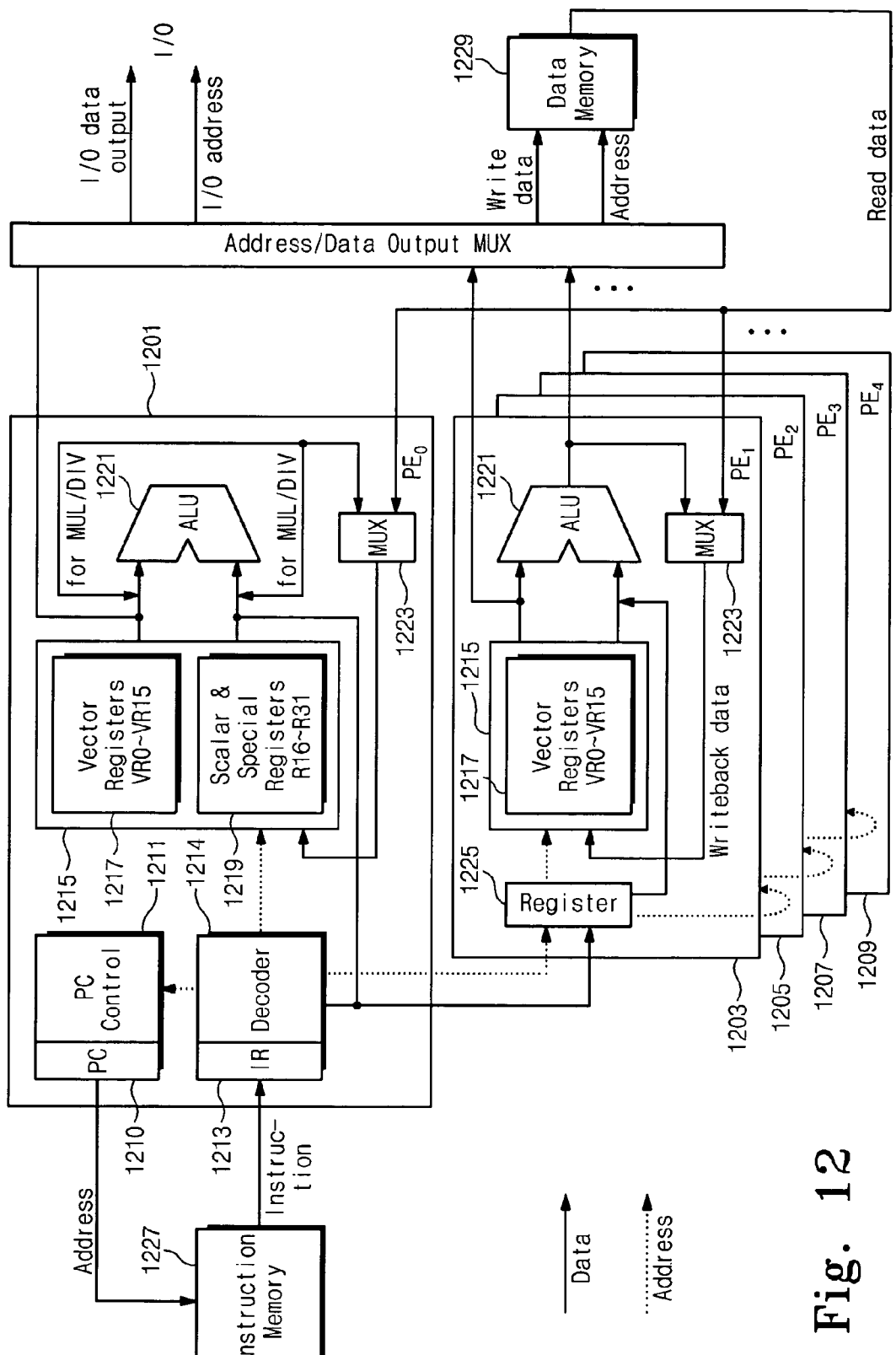
FIG. 12 illustrates a detailed SIMD processor of FIG. 8.

To keep pace with the hardware SISO described with reference to FIGS. 10 and 11, it is preferable that interleaved address generation be performed in parallel. The present invention employs SIMD architecture because it is suitable for the simple and repetitive address generation and has simpler control and lower power consumption than superscalar or very long instruction word (VLIW) processor. FIG. 12 illustrates detailed SIMD processor of FIG. 8. In FIG. 12, a dotted line indicates control flow and a solid line indicates data flow. Considering the number of rows of W-CDMA block interleaver is a multiple of five, the SIMD processor 1200 includes five processing elements PE0~PE4. The bit widths of instructions and data are 16. The first processing element PE0 (1201) controls the other four processing elements PE1~PE4 and in addition it processes a scalar operation. The first processing element PE0 1201 fetches, decodes, and executes instructions including control and multi-cycle scalar instructions while the other four processing elements PE1~PE4 only execute SIMD instructions. An instruction corresponding to program counter (PC) 1210 is fetched from instruction memory 1227 and temporarily stored into the instruction register (IR) 1213. The fetched instruction is decoded by the decoder 1214 and then the decoded instruction is executed in each the processing elements PE0~PE4, for example, each ALU 1221 executes add operations. After execution of the instruction is complete, a program counter (PC) 1210 is incremented by PC controller 1211 and a new instruction is fetched from the instruction memory 1227. The other four processing elements PE1 (1203), PE2 (1205), PE3 (1207), and PE4 (1209) execute SIMD instructions. All the processing elements PE0~PE4 include resister block 1215 for storing data for parallel operations. The register block 1215 includes vector resisters VR0~VR15 (1217). The register block 1215 of the first processing element PE0 also includes additional scalar resisters 1219 to store scalar and control data. The second and fifth processing elements PE1~PE4 include register 1225 for temporarily storing encoded instruction. The SIMD instruction is not executed in all processing elements at the same time, but executed in one processing element after another so that a data memory port and I/O port can be shared in a time-multiplexed fashion, which saves memory access power and provides a simple I/O interface.

As mentioned before, specialized SIMD processor instructions, STOLT, SUBGE, and LOOP, are employed to replace frequent instruction sequences of three typical RISC instructions appearing in turbo interleaver programs, STOLT and SUBGE and SIMD instructions, whereas LOOP is a scalar control instruction, which is executed only in PE0.

According to at least one embodiment of the present invention, the two stages of the block turbo interleaver perform preprocessing and on-the-fly generation in the SIMD processor. The speed of on-the-fly generation dramatically improves using the SIMD processor because of its SIMD parallel processing capability and its support of three special instructions.

It should be noted that many variations and modifications may be made to embodiments described above without substantially departing from the principles of the present invention. All such variations and modifications are intended to be included herein within the scope of the present invention, as set forth in the following claims.

What is claimed is:

1. A turbo decoding system comprising:
a block interleaver;
an address queue for storing a generated interleaved address that is equal or smaller than a size of a data block;
an SISO decoder performing recursive decoding and calculating log likelihood ratio; and
an LLR memory connected to the SISO decoder and storing the log likelihood ratio, wherein the block interleaver comprises a preprocessor for preparing seed variables and an address generator for generating an interleaved address on the fly using the seed variables, wherein the SISO decoder accesses the data block and the log likelihood ratio in a sequential order and in an interleaved order alternately by the generated interleaved address,
wherein the generated interleaved address is once stored in the address queue and reused as a write address for writing the log likelihood ratio outputted from the SISO decoder into the LLR memory.

2. The turbo decoding system of claim 1, wherein the length of the address queue is equal to the SISO latency.

3. The turbo decoding system of claim 1, wherein the seed variables include a base column vector, an increment column vector, a cumulative column vector, and a modulo base, the number of elements of all three column vectors is equal to the number of rows of the block interleaver, and the elements of the column vectors are arranged by inter-row permutation, and wherein the cumulative column vector is updated by adding the increment vector to the old cumulative vector, then the interleaved addresses for one column are generated by adding the base vector and a vector that is calculated from the cumulative vector, and wherein elements of the updated cumulative column vector larger than the modulo base are reduced by the modulo base.

4. A turbo decoding system comprising:
a processor for generating interleaved addresses, wherein the processor is a single-instruction multiple-data (SIMD) processor;
an address queue for storing the interleaved addresses;
a buffer memory block including an LLR memory for storing log likelihood ratio and a plurality of memory blocks for storing soft inputs; and
an SISO decoder connected to the buffer memory block, the SISO decoder including an ACSA network for calculating a log likelihood ratio recursively from soft inputs and the log likelihood provided by the LLR memory and a plurality of memory blocks connected to the ACSA network.

5. The turbo decoding system of claim 4, wherein the SISO decoder supports a Viterbi decoding mode, wherein in Viterbi decoding mode, the ACSA network performs Viterbi recursion, the LLR memory stores traceback information outputted by the ACSA network, the processor performs a traceback from the traceback information read from the LLR memory, and one of the memory blocks of the SISO decoder stores a path metric outputted by the ACSA network.

6. The turbo decoding system of claim 4, wherein the SIMD processor includes five processing elements for parallel processing, and wherein one of five processing elements controls the other four processing elements, processes scalar operation, and fetches, decodes, and executes instructions including control and multi-cycle scalar instructions, and wherein the other four processing elements only execute SIMD instructions.

7. The turbo decoding system of claim 4, wherein the SIMD processor includes five processing elements, and wherein one of five processing elements controls the other four processing elements, processes scalar operation, and fetches, decodes, and executes instructions including control and multi-cycle scalar instructions, and wherein the other four processing elements only execute SIMD instructions.

8. The turbo decoding system of claim 4, wherein the processor prepares seed variables when an interleaver structure changes due to a change of a coding standard or bit rate, and generates the interleaved addresses column by column using the seed variables when the interleaved addresses are required.

9. The turbo decoding system of claim 8, wherein the generated interleaved address is reused as a write address for writing the log likelihood ratio outputted from the SISO decoder into the LLR memory.

10. The turbo decoding system of claim 8, wherein the seed variables include a base column vector, an increment column vector, a cumulative column vector, and a modulo base, the number of elements of all three column vectors is equal to the number of rows of the interleaver, and the elements of the column vectors are arranged by inter-row permutation, and wherein the cumulative column vector is updated by adding the increment vector to the old cumulative vector, then the interleaved addresses for one column are generated by adding the base vector and a vector that is calculated from the cumulative vector, and wherein elements of the updated cumulative column vector are larger than the modulo base are reduced by the modulo base.

11. The turbo decoding system of claim 10, wherein the processor uses STOLT, SUBGE, LOOP instructions for fast calculation of interleaved addresses.

12. An interleaver for rearranging sequences of data blocks in a data processing system, the interleaver comprising:
    a preprocessor for preparing seed variables that vary according to the interleaving method of each of a plurality of standards and bit rates; and
    an address generator means for generating an interleaved address on the fly using the seed variables,
    wherein the seed variables include a base column vector, an increment column vector, a cumulative column vector, and a modulo base, the number of elements of all three column vectors is equal to the number of rows of the interleaver, and the elements of the column vectors are arranged by inter-row permutation in advance at the preprocessing, and
    wherein the cumulative column vector is updated by adding the increment vector to an old cumulative vector, then the interleaved addresses for one column are generated by adding the base vector and a vector that is calculated from the cumulative vector, and
    wherein elements of the updated cumulative column vector larger than the modulo base are reduced by the modulo base.

13. The interleaver of claim 12, wherein the number of seed variables is less than a size of a data block.

14. An interleaving method for rearranging a data block in a data communication system, comprising:
    preparing seed variables; and
    generating interleaved addresses column by column using the seed variables,
    wherein the seed variables include a base column vector, an increment column vector, a cumulative column vector, and a modulo base, the number of elements of all three column vectors is equal to the number of rows of the interleaver, and the elements of the column vectors are arranged by inter-row permutation, and
    wherein the cumulative column vector is updated by adding the increment vector to the old cumulative vector, then the interleaved addresses for one column are generated by adding the base vector and a vector that is calculated from the cumulative vector, and
    wherein elements of the updated cumulative column vector are larger than the modulo base are reduced by the modulo base.

15. The interleaving method of claim 14, wherein the seed variables are prepared when an interleaver structure changes due to a change of the coding standard or bit rate, and the interleaved addresses are generated column by column using the seed variables when the interleaved addresses are required.

* * * * *